(12) United States Patent
Moore

(10) Patent No.: US 6,912,601 B1
(45) Date of Patent: Jun. 28, 2005

(54) METHOD OF PROGRAMMING PLDS USING A WIRELESS LINK

(75) Inventor: Michael T. Moore, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 682 days.

(21) Appl. No.: 09/605,325

(22) Filed: Jun. 28, 2000

(51) Int. Cl.[7] .............................................. G06F 3/00
(52) U.S. Cl. ......................... 710/10; 710/8; 326/37; 326/39; 716/16; 716/18
(58) Field of Search ................... 710/8–14; 326/37–39; 716/15–17; 714/718–723

(56) References Cited

U.S. PATENT DOCUMENTS

| | | | |
|---|---|---|---|
| 4,051,352 A | 9/1977 | Eichelberger et al. ...... 364/716 |
| 4,940,909 A | 7/1990 | Mulder et al. ............... 307/465 |
| 5,204,663 A | 4/1993 | Lee ........................ 340/825.34 |
| 5,237,699 A | 8/1993 | Little et al. .................. 395/750 |
| 5,241,224 A | 8/1993 | Pedersen et al. ............ 307/465 |
| 5,268,598 A | 12/1993 | Pedersen et al. ............ 307/465 |
| 5,287,017 A | 2/1994 | Narasimhan et al. ....... 307/465 |
| 5,364,108 A * | 11/1994 | Esnouf .......................... 463/9 |
| 5,384,499 A | 1/1995 | Pedersen et al. ............. 326/39 |
| 5,386,155 A | 1/1995 | Steele et al. .................. 326/37 |
| 5,426,744 A | 6/1995 | Sawase et al. .............. 395/375 |
| 5,511,211 A | 4/1996 | Akao et al. ................. 395/800 |
| 5,548,228 A | 8/1996 | Madurawe .................... 326/41 |
| 5,548,552 A | 8/1996 | Madurawe ............. 365/185.33 |
| 5,550,842 A | 8/1996 | Tran ......................... 371/21.4 |
| 5,557,217 A | 9/1996 | Pedersen et al. ............. 326/39 |
| 5,572,148 A | 11/1996 | Lytle et al. .................... 326/41 |
| 5,594,367 A | 1/1997 | Trimberger et al. .......... 326/41 |
| 5,598,108 A | 1/1997 | Pedersen ...................... 326/41 |
| 5,603,043 A * | 2/1997 | Taylor et al. ................... 712/1 |
| 5,608,337 A | 3/1997 | Hendricks et al. .......... 324/765 |
| 5,625,563 A * | 4/1997 | Rostoker et al. ............... 716/2 |
| 5,752,063 A | 5/1998 | DeRoo et al. .............. 395/800 |
| 5,757,207 A | 5/1998 | Lytle et al. .................... 326/39 |
| 5,760,607 A | 6/1998 | Leeds et al. ................... 326/38 |
| 5,798,656 A | 8/1998 | Kean ............................ 326/39 |
| 5,864,486 A * | 1/1999 | Deming et al. ............... 716/17 |
| 5,990,717 A | 11/1999 | Partovi et al. .............. 327/210 |
| 6,005,806 A | 12/1999 | Madurawe et al. .... 365/185.23 |
| 6,023,570 A | 2/2000 | Tang et al. ............. 395/500.18 |
| 6,025,737 A | 2/2000 | Patel et al. .................... 326/80 |
| 6,389,321 B2 * | 5/2002 | Tang et al. ..................... 700/2 |
| 6,401,224 B1 * | 6/2002 | Schoniger et al. .......... 714/718 |
| 6,446,242 B1 * | 9/2002 | Lien et al. ...................... 716/6 |
| 6,448,820 B1 * | 9/2002 | Wang et al. .................. 327/12 |

FOREIGN PATENT DOCUMENTS

| | | | |
|---|---|---|---|
| EP | 420388 A2 | 4/1991 | ......... G01R/31/318 |
| EP | 455414 A2 | 11/1991 | ......... H01L/23/525 |
| EP | 510815 A2 | 10/1992 | ......... H03K/19/177 |

OTHER PUBLICATIONS

Microcontroller Acceleration, By Jesse Jenkins, 1993 IEEE, pp. 416–424.
A Family of User–Programmable Peripherals with a Functional Unit Architecture, By A.S. Shubat et al., 1992 IEEE, pp. 515–529.

(Continued)

*Primary Examiner*—Jeffrey Gaffin
*Assistant Examiner*—Mike Nguyen
(74) *Attorney, Agent, or Firm*—Christopher P. Maiorana, PC

(57) ABSTRACT

An apparatus comprising a wireless transceiver and a programmable logic circuit. The wireless transceiver may be coupled to the programmable logic circuit. The programmable logic circuit may comprise a programmable logic device, a processor, and a memory circuit, implemented in a single integrated circuit package.

23 Claims, 4 Drawing Sheets

OTHER PUBLICATIONS

A User–Programmable Peripherial With Functional Unit Architecture, By A. Shubat et al., pp. 23–24.

A 10ns, 4000 Gate, 160 Pin CMOS EPLD Developed on a 0.8um Process, By R. Patel et al., 1993 IEEE, pp. 7.6.1–7.6.5.

Obtaining 70MHz Performance in the MAX Architecture, By S. Kopec et al., May 1991, pp. 69–74.

SIPPOS (Single Poly Pure CMOS) EEPROM Embedded FPGA by News Ring Interconnection and Highway Path, By K. Ohsaki et al., 1994 IEEE, pp. 9.4.1–9.4.4.

Intel's FLEXlogic FPGA Architecture, By D.E. Smith, 1993 IEEE, pp. 378–384.

Dual and Fail–Safe Redundancy for Static Mask–ROMs and PLAs, By N. Tsuda, 1993 IEEE, pp. 57–66.

A 0.5um Technology for Advanced Microcontroller Applications, By U. Shama et al., 1994 IEEE, pp. 67–68.

A Large Scale FPGA with 10K Core Cells with CMOS 08.um 3–Layered Metal Process, By H. Muroga et al., 1991 IEEE, pp. 6.4.1–6.4.4.

Session 15: High–Speed Digital Circuits, FAM 15.5: A 9ns, Low Standby Power CMOS PLD with a Single–Poly EPROM Cell, By S. Frake et al., Feb. 17, 1989, pp. 344–346.

A Microcontroller Embedded with 4Kbit Ferroelectric Non–Volatile Memory, By T. Fukushima et al., 1996 IEEE, pp. 46–47.

Integrated Circuits for Smart Cards, By Julie Krueger, Oct. 9–12, 1995, pp. 1168–1170.

1.5V High Speed Read Operation and Low Power Consumption Circuit Technology for EPROM and Flash–EERPOM, By O. Matsumoto et al., 1993 IEEE, pp. 25.4.1–25.4.4.

Integrated Memory Elements on Microcontroller Devices, By Charles Melear, pp. 507–514.

Analog Counterparts of FPGAs Ease System Design, By F. Goodenough, Oct. 14, 1994, pp. 63–72.

PSD301 Programmable Peripheral With Memory for Microcontroller and Embedded Microprocessor Applications, by Chris Jay, 1991.

Single Chip Microcontroller with Internal EPROMs, By M. Yamamoto et al., National Technical Report, vol. 36, No. 3, Jun. 1990, pp. 295–302.

* cited by examiner

METHOD OF PROGRAMMING PLDS USING A WIRELESS LINK

FIELD OF THE INVENTION

The present invention relates to a method and/or architecture for programming programmable logic devices (PLDs) generally and, more particularly, to a method and/or architecture for programming PLDs using a wireless link.

BACKGROUND OF THE INVENTION

Programmable logic devices (PLDs) that can be programmed and reprogrammed without being removed from an application environment are needed in many applications. Programming a PLD is typically achieved by transferring a bit pattern into the programmable logic device. The bit pattern determines the arrangement and operation of resources in the programmable logic device. The process of designing with PLDs includes fitting a design to a device by determining the required resources and timing. A programming file is then generated that contains the required bit pattern for the PLD.

A reprogrammable system can be reprogrammed by a host programming device. Programming instructions can be communicated over a hard-wired (physical) or a wireless connection. Most devices are currently programmed in system using a cable or other physical connection to the host. A system that uses a wireless link may be found in U.S. Pat. No. 6,023,570, which is hereby incorporated by reference in its entirety. The wireless system requires a microprocessor connected to a wireless transceiver and to a number of PLDs on a printed circuit board (PCB). A personal computer (PC) or workstation ATE tester sends data to the microprocessor over the wireless link. The microprocessor then programs the PLDs. When programming is completed, the microprocessor and wireless transceiver serve no other function.

A disadvantage of such a conventional wireless system is that additional hardware is required. The additional hardware includes a printed circuit board containing the number of PLDs, a programmer, and an access interface (i.e., a serial or parallel port interface) that connects the programmer to a host controller over the communication link. The conventional programmer contains a microprocessor, a random access memory (RAM), a non-volatile memory (i.e., EPROM), and a number of signal latches.

A PLD that could be programmed and reprogrammed using a wireless link without requiring additional hardware or removal from a system would be very useful.

SUMMARY OF THE INVENTION

The present invention concerns an apparatus comprising a wireless transceiver and a programmable logic circuit. The wireless transceiver may be coupled to the programmable logic circuit. The programmable logic circuit may comprise a memory circuit, a processor, and a programmable logic device implemented in a single integrated circuit package.

The objects, features and advantages of the present invention include providing a method and/or architecture for programming a programmable logic device (PLD) using a wireless link that may (i) require minimal additional hardware, (ii) include a microprocessor, micro-controller, or digital signal processor (DSP) functionality, (iii) reduce component count and printed circuit board area requirements, (iv) be less expensive to implement than conventional approaches and/or (v) not require extra die area compared with conventional approaches.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
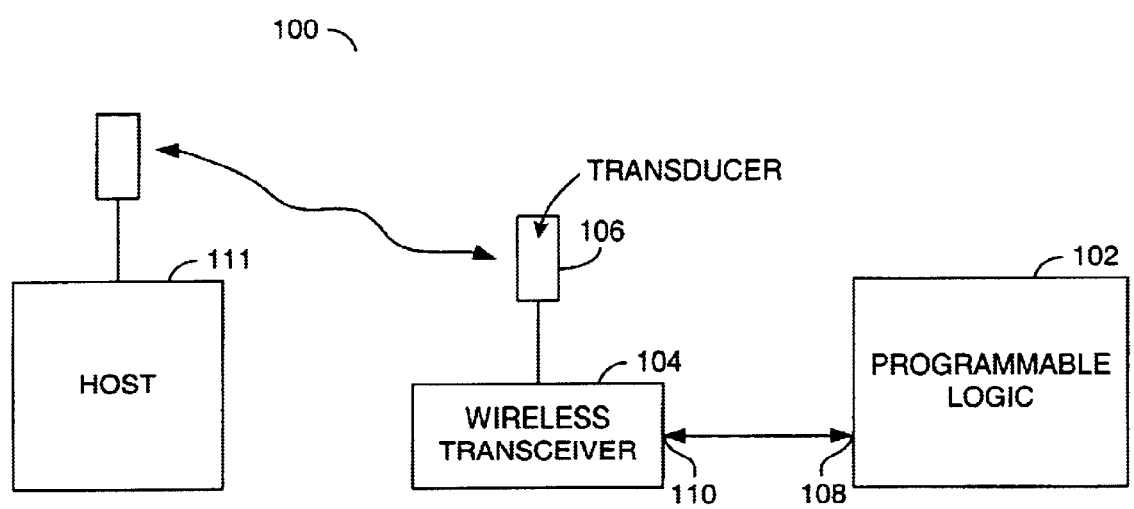
FIG. 1 is a block diagram of a preferred embodiment of the present invention.

Referring to FIG. 1, a block diagram of a circuit 100 is shown in accordance with a preferred embodiment of the present invention. The circuit 100 may be implemented, in one example, as a programmable logic device (PLD) that may be programmed and/or reprogrammed while in a system, using a wireless link. The circuit 100 may implement the wireless link using a wireless protocol. In one example, the wireless protocol may be implemented in accordance with the Bluetooth™ protocol (Bluetooth is a trademark of Telefonakiebolaget LM Ericsson, Stockholm Sweden). A description of the Bluetooth™ protocol may be found in the BLUETOOTH SPECIFICATION version 1.0A, published Jul. 24, 1999 (revised Dec. 1, 1999), which is hereby incorporated by reference in its entirety.

The wireless link may comprise, in one example, radio waves, infrared or other wavelength light, ultrasonic waves, and/or any other media of communication that generally do not require a physical connection. The present invention may provide a single chip solution (or a multiple chip solution within one integrated circuit package) that may be less expensive to implement and may require less hardware, compared with previous solutions. A PLD implemented in accordance with the present invention may reduce printed circuit board area requirements of a system.

The circuit 100 may comprise a circuit 102, a circuit 104 and a transducer 106. The circuit 102 may be implemented, in one example, as a single chip wirelessly programmable PLD. For example, the circuit 102 may be implemented on a single integrated circuit. Alternatively, the circuit 102 may be implemented on multiple integrated circuits as a multi-chip module (MCM). The individual integrated circuits or dies may be encased in a single integrated circuit package.

The circuit 104 may be implemented, in one example, as a wireless transceiver circuit. The transducer 106 may be implemented, in one example, as a device that may couple a host system and the circuit 104 via a wireless medium. For example, the transducer 106 may be an antenna, an infrared (or other wavelength of light) device (e.g., a light emitting diode (LED) and/or a photo transistor), or an ultrasonic transducer. However, other types of transducers may be implemented accordingly to meet the design criteria of a particular application.

The circuits 102 and 104 may be implemented, in one example, as a multi-chip module with two or more integrated circuits mounted in a single integrated circuit package. In one example, the transducer 106 (e.g., a radio frequency antenna, etc.) may also be included in the single integrated circuit package with the circuit 102 and the circuit 104.

The circuit 102 may have an input/output 108 that may be connected to an input/output 110 of the circuit 104. In general, signals may be received from, or sent to, a host system 111 by the circuit 102 via the circuit 104 and the transducer 106. The circuit 102 may be configured, in one example, to (i) perform a reprogramming operation in response to signals received from the host system via the wireless link and/or (ii) verify completion and/or success of the programming operation by presenting signals to the host system via the wireless link.

Figure 2:
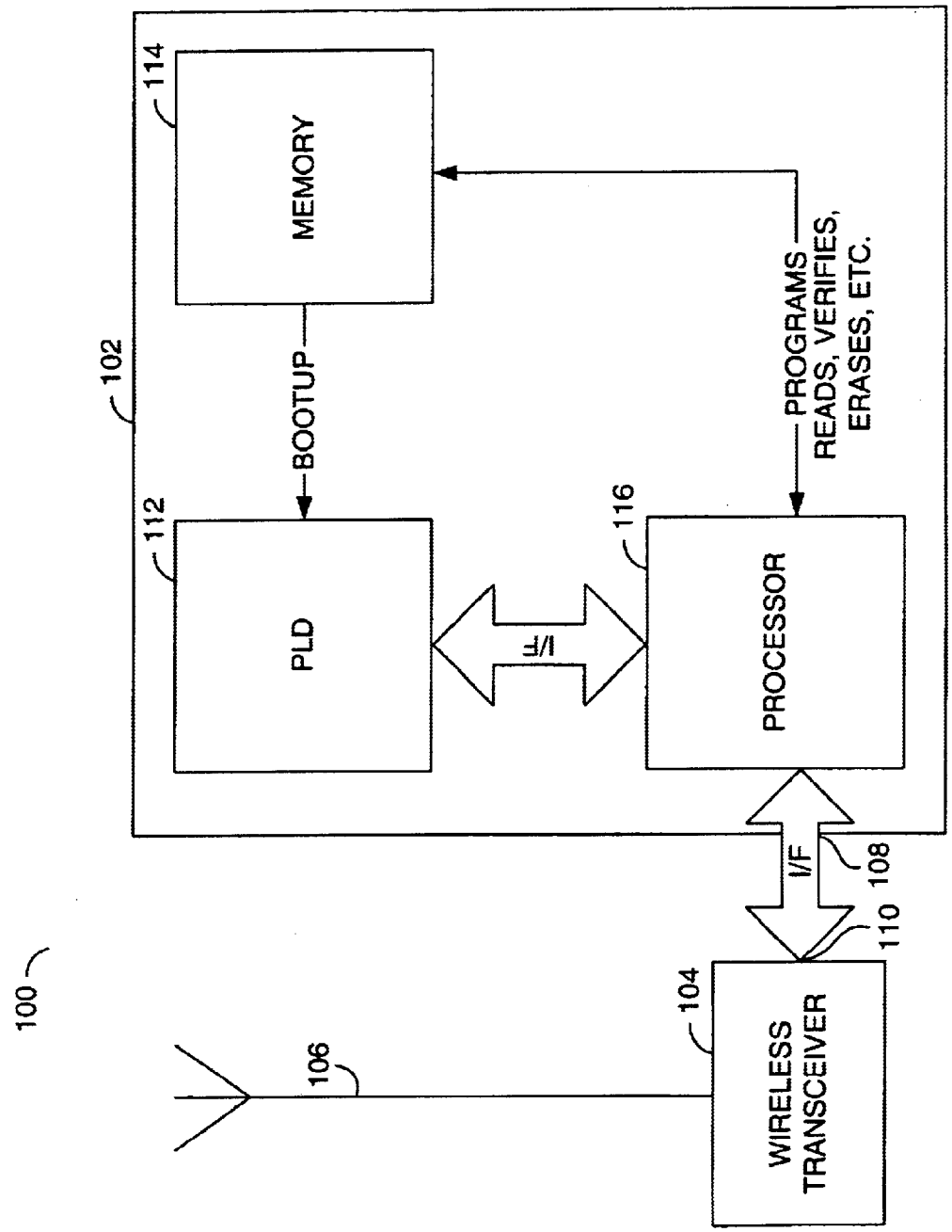
FIG. 2 is a block diagram of a preferred embodiment of the present invention.

Referring to FIG. 2, a block diagram illustrating an implementation of the circuit 100 in-accordance with the present invention is shown. The circuit 102 may be implemented, in one example, as a microprocessor, micro-controller, or digital signal processor in a single package with a PLD and/or memory. The circuit 102 may comprise, in one example, a programmable logic device 112, a memory circuit 114, and a processor circuit 116. The PLD 112 may be implemented, in one example, using currently existing programmable logic devices. The memory circuit 114 may be implemented, in one example, as a non-volatile memory (e.g., FLASH memory, EPROM, EEPROM, etc.). However, other types of non-volatile memory may be implemented accordingly to meet the design criteria of a particular application. The processor circuit 116 may be implemented, in one example, as a microprocessor ($\mu$P), a micro-controller ($\mu$C), a digital signal processor (DSP), or other appropriate processor. The processor circuit 116 may be configured, in one example, to (i) communicate with a host system via the wireless transceiver 104 and (ii) program either the PLD 112 or the memory circuit 114 in response to signals from the wireless transceiver 104. The memory circuit 114 may be configured to store configuration data received from the processor 116. The configuration data stored in the memory circuit 114 may be used for programming the PLD 112 upon bootup. The PLD 112 may be connected to the processor 116 by a bidirectional bus. The PLD 112 may be configured, in one example, to communicate with and/or control the processor 116. In one example, the functionality of the PLD 112 may be augmented by the additional functionality of the processor 116 alone or in combination with the wireless transceiver 104.

The PLD 112, the memory circuit 114 and the processor circuit 116 may be implemented, in one example, on individual silicon dies. The individual dies may be encased together in a single integrated circuit package. The package may be, in one example, an integrated circuit package in accordance with the JEDEC standard. Alternatively, the integrated circuit package may be a multi-chip module.

Figure 3:
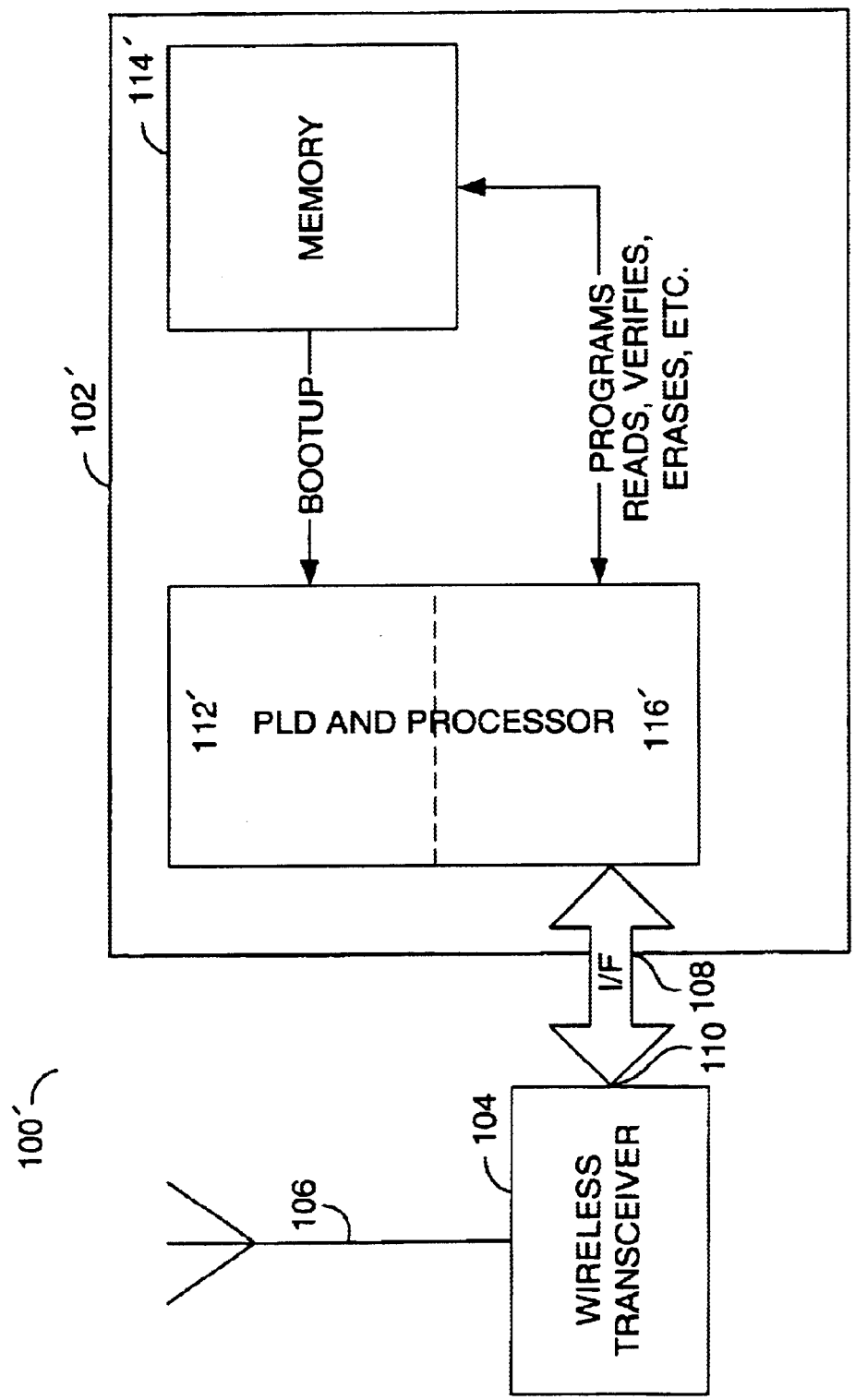
FIG. 3 is a block diagram of an alternative embodiment of the present invention.

Referring to FIG. 3, a block diagram of a circuit 100' illustrating an alternative embodiment of the present invention is shown. The circuit 100' may be implemented similarly to the circuit 100 except that the circuit 100' may comprise a circuit 102'. The circuit 102' may be implemented using a first and a second die. The first die may contain a memory circuit 114' and the second die may contain both a PLD 112' and a processor 116'. By implementing the PLD 112' and the processor 116' on a single-die, the circuit 102' may provide for easier and less expensive packaging. The memory circuit 114' may be implemented similarly to the memory circuit 114 described above in connection with FIG. 2. The processor 116' may be implemented as a microprocessor, a micro-controller, a digital signal processor, or other appropriate processor. The PLD 112' and processor 116' may be configured, in one example, so that the PLD 112' may access the transceiver 104 through the processor 116'. The use of the processor 116' to access the transceiver 104 may be transparent to the PLD 112'. Alternatively, the PLD 112' may access all control, input/output, and other appropriate pins of the processor 116' as if they were resources accessible to a user from within the design. In one example, the processor may be initiated and used as a functional block in the design. In another alternative, the PLD 112' may bypass the processor 116' (e.g., the processor may appear transparent) to access the transceiver 104 and/or memory 114'.

Upon bootup, the memory 114' may be configured to program the PLD 112'. The processor 116' may be configured to program the memory 114' in response to signals from the wireless transceiver 104. The processor 116' may present signals to the wireless transceiver 104 that may indicate a status of the programming operation. When the circuit 100' is rebooted, the new programming in the memory 114' may reconfigure the PLD 112'.

Figure 4:
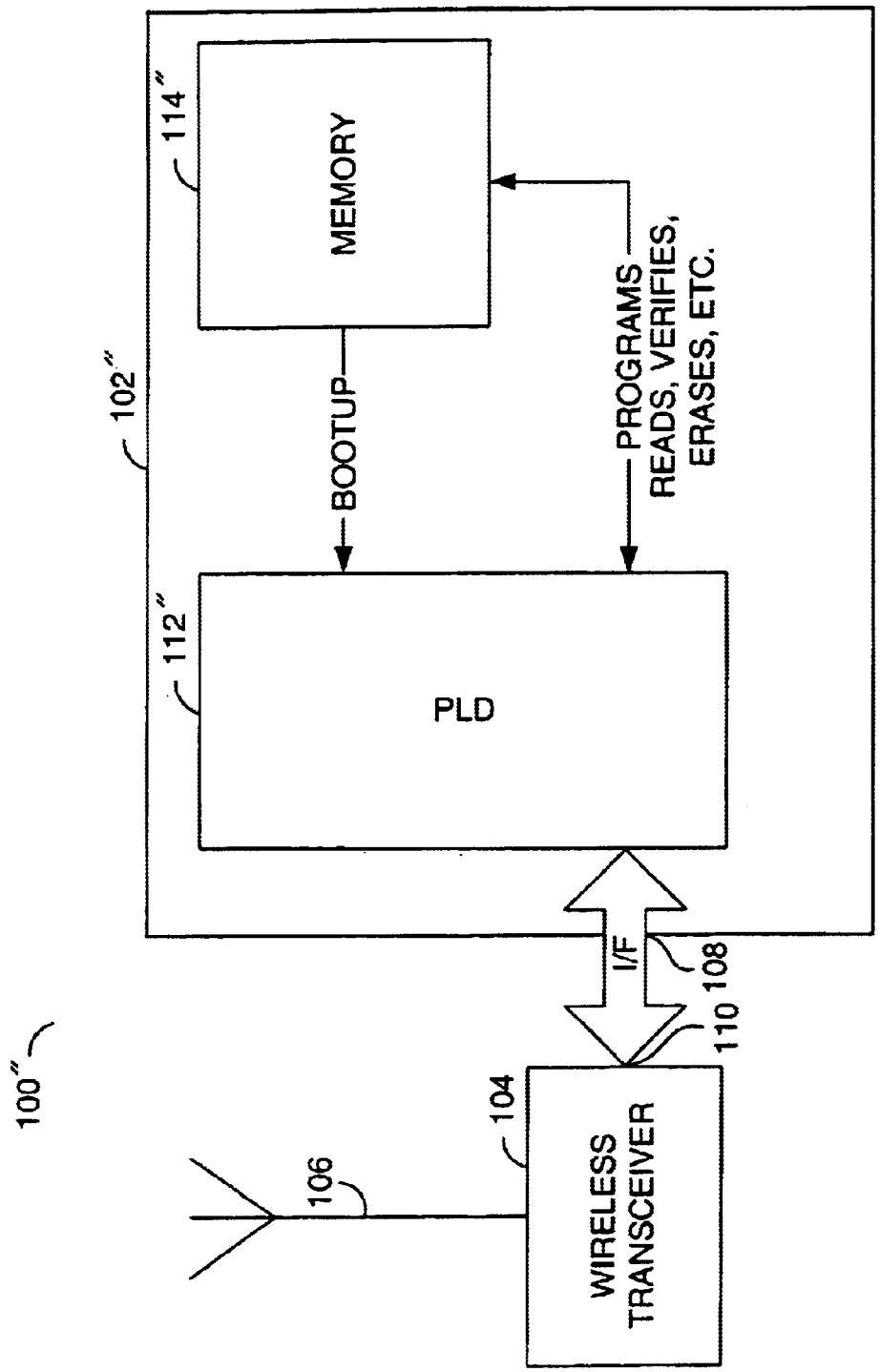
FIG. 4 is a block diagram of another alternative embodiment of the present invention.

Referring to FIG. 4, a block diagram of a circuit 100" illustrating another alternative embodiment of the present invention is shown. The circuit 100" may be implemented similarly to the circuit 100 except that the circuit 100" may comprise a circuit 102". The circuit 102" may comprise a PLD 112" and a memory circuit 114". The memory circuit 114" may be implemented similarly to the memory circuit 114 described above in connection with FIG. 2. The circuit 100" may comprise a die containing the memory circuit 114" and a die containing the PLD 112". When the circuit 100" is manufactured, the circuit 100" may incorporate a microprocessor, micro-controller, a digital signal processor, or other appropriate functionality into the memory 114" or other memory that may be on the PLD die (e.g., mask programmable ROM or other memory type). The memory on the PLD die may be implemented, in one example, as any type of non-volatile or one-time programmable memory. The memory circuit 114" may be programmed when the device is leaving the factory with instructions for configuring the PLD 112" to operate as the microprocessor, the micro-controller, the digital signal processor, or other appropriate functionality.

Upon a first bootup, the PLD 112" may be configured as the microprocessor, the micro-controller, the digital signal processor, etc., in response to the instructions stored in the memory 114". When the PLD 112" is configured as a microprocessor (or other processor configuration), the PLD 112" may communicate with the wireless transceiver 104 to receive data for reprogramming the memory circuit 114" with a desired configuration for the PLD 112". The new programming in the memory 114" may reconfigure the PLD 112" during subsequent bootups.

The present invention may combine a programmable logic device with a processor. Alternatively, the processor may comprise a memory containing instructions for configuring the PLD as a processor. When the present invention is implemented with a separate PLD and processor, the PLD may be configured to implement logic circuits that may take advantage of the separate microprocessor for enhanced functionality. In one example, the wireless transceiver and transducer may be used to provide input and output to the PLD. A PLD implemented in accordance with the present invention may be programmed or reprogrammed without (i) being removed from a system or (ii) requiring a physical connection to the programming system.

The present invention may provide a method and/or architecture for programming a programmable logic device (PLD) using a wireless link that may (i) require minimal additional hardware, (ii) provide a PLD that includes a microprocessor, a micro-controller, a digital signal processor (DSP), or other processor functionality, (iii) reduce component count and printed circuit board area requirements, (iv) be less expensive to implement than conventional approaches and/or (v) require no extra die area compared with conventional approaches.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
a wireless transceiver coupled to a programmable logic circuit, wherein (i) said programmable logic circuit comprises a programmable logic device, a processor, and a memory circuit in a single integrated circuit (IC) package, (ii) said programmable logic device, said processor, and said memory circuit are coupled together and (iii) said processor is configured to communicate with a host system via said wireless transceiver and to program said programmable logic device via an interface configured to couple said processor and said programmable logic device.

2. The apparatus according to claim 1, wherein said single integrated circuit package contains one or more integrated circuit dies.

3. The apparatus according to claim 1, wherein said integrated circuit comprises a JEDEC standard integrated circuit package.

4. The apparatus according to claim 1, wherein said wireless transceiver is contained within said package.

5. The apparatus according to claim 1, wherein said wireless transceiver communicates using either electromagnetic or ultrasonic waves.

6. The apparatus according to claim 5, wherein said electromagnetic waves comprise radio signals or infrared light.

7. The apparatus according to claim 1, wherein said wireless transceiver communicates through a device selected from the group consisting of an antenna, a light emitting/sensitive device, and an ultrasonic transducer.

8. The apparatus according to claim 7, wherein said light emitting/sensitive device comprises an infrared diode or other type or wavelength of light emitting/sensitive diode or transistor.

9. The apparatus according to claim 1, wherein said processor and said programmable logic device are implemented on a single die.

10. The apparatus according to claim 1, wherein said processor is selected from the group consisting of a microprocessor, a micro-controller or other processor, a digital signal processor, and instructions stored in said memory circuit for configuring said programmable logic circuit as a processor.

11. The apparatus according to claim 10, wherein said instructions configure said programmable logic device as a device selected from the group consisting of a microprocessor, a micro-controller, and a digital signal processor.

12. The apparatus according to claim 1, wherein said memory circuit comprises one or more non-volatile memory elements.

13. The apparatus according to claim 1, wherein said programmable logic device comprises one or more memory elements.

14. The apparatus according to claim 13, wherein said memory elements are non-volatile.

15. A method for programming a programmable logic device using a wireless link comprising the steps of:
(A) presenting programming signals to a wireless transceiver; and
(B) programming a programmable logic circuit in response to said programming signals, wherein (i) said programmable logic circuit comprises a programmable logic device, a memory circuit, and a processor in a single integrated circuit package, (ii) said programmable logic device, said processor, and said memory circuit are coupled together and (iii) said processor is configured (a) to communicate with a host system via said wireless transceiver and (b) to program said programmable logic device in response to said programming signals via an interface coupling said processor and said programmable logic device.

16. The method according to claim 15, wherein said wireless transceiver is contained in said integrated circuit package.

17. The method according to claim 15, further comprising the steps of:
(C) during a first bootup, configuring said programmable logic device as said processor in response to instructions stored in said memory circuit; and
(D) reprogramming said memory circuit in response to said programming signals.

18. An apparatus comprising:
a programmable logic device;
a memory circuit;
a processor;
a first interface configured to couple said processor to said programmable logic device; and
a wireless transceiver, wherein (a) said programmable logic device, said memory circuit, and said processor are (i) encased in a single integrated circuit (IC) package and (ii) coupled together and (b) said processor is configured (i) to communicate with a host system via said wireless transceiver and (ii) to program said programmable logic device.

19. The apparatus according to claim 18, wherein said wireless transceiver is contained within said integrated circuit package.

20. The apparatus according to claim 18, further comprising a transducer coupled to said wireless transceiver.

21. The apparatus according to claim 18, further comprising:
a second interface configured to couple said programmable logic device with said memory circuit, wherein said programmable logic device is configured by said memory circuit during bootup.

22. The apparatus according to claim 18, further comprising:
a second interface configured to couple said processor with said memory circuit, wherein said processor is configured to perform one or more of (i) programming said memory circuit, (ii) reading said memory circuit, (iii) verifying said memory circuit and (iv) erasing said memory circuit.

23. The apparatus according to claim 18, further comprising:
a second interface configured to couple said programmable logic device with said memory circuit, wherein said programmable logic device is configured by said memory circuit during bootup; and
a third interface configured to couple said processor with said memory circuit, wherein said processor is further configured to perform one or more of (i) programming said memory circuit, (ii) reading said memory circuit, (iii) verifying said memory circuit, and (iv) erasing said memory circuit.

* * * * *